(12) United States Patent
Yamanaka et al.

(10) Patent No.: US 9,154,720 B2
(45) Date of Patent: Oct. 6, 2015

(54) DISPLAY DEVICE AND TELEVISION DEVICE

(71) Applicant: Funai Electric Co., Ltd., Osaka (JP)

(72) Inventors: Takahito Yamanaka, Osaka (JP); Yasuhiro Mori, Osaka (JP); Yuki Kita, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 325 days.

(21) Appl. No.: 13/645,018

(22) Filed: Oct. 4, 2012

(65) Prior Publication Data

US 2013/0100355 A1    Apr. 25, 2013

(30) Foreign Application Priority Data

Oct. 25, 2011 (JP) ................... 2011-233797

(51) Int. Cl.
*H05K 7/06* (2006.01)
*H04N 5/655* (2006.01)
*H05K 9/00* (2006.01)

(52) U.S. Cl.
CPC .............. *H04N 5/655* (2013.01); *H05K 9/0054* (2013.01)

(58) Field of Classification Search
CPC ......... H04N 5/655; H04N 5/64; H04N 5/645; H04N 5/642; H05K 9/0054; G06F 1/1601
USPC ........................................................ 348/836
See application file for complete search history.

(56) References Cited

U.S. PATENT DOCUMENTS

| | | | | |
|---|---|---|---|---|
| 4,772,100 A | * | 9/1988 | Suenaga | 349/58 |
| 5,011,266 A | * | 4/1991 | Suzuki et al. | 349/74 |
| 5,067,796 A | * | 11/1991 | Suzuki et al. | 349/149 |
| 6,154,265 A | * | 11/2000 | Kamio et al. | 349/122 |
| 7,854,484 B2 | * | 12/2010 | Takeda | 312/7.2 |
| 8,941,569 B2 | * | 1/2015 | Tsubata | 345/87 |
| 2007/0117432 A1 | * | 5/2007 | Kim et al. | 439/171 |
| 2007/0268444 A1 | * | 11/2007 | Azuma et al. | 349/150 |
| 2009/0002594 A1 | * | 1/2009 | Okumura et al. | 349/60 |

(Continued)

FOREIGN PATENT DOCUMENTS

| | | |
|---|---|---|
| JP | 2003-015150 A | 1/2003 |
| JP | 2009-009032 A | 1/2009 |
| WO | 2011/093049 A1 | 8/2011 |

OTHER PUBLICATIONS

Extended European Search Report issued in corresponding European Application No. 13151942.3 dated Jul. 19, 2013 (8 pages).

(Continued)

*Primary Examiner* — Shan Elahi
(74) *Attorney, Agent, or Firm* — Osha Liang LLP

(57) ABSTRACT

A display device includes a display part that displays images on a front surface, a board attachment material configured to support the display part from a rear surface that is opposite the front surface of the display part, and a circuit board attached in the board attachment area on the non-electroconductive surface side of the board attachment material. The board attachment material includes a non-electroconductive surface having no electroconductivity placed on the rear surface side, an electroconductive surface having electroconductivity placed on a side opposite to the non-electroconductive surface side, and a board attachment area on the non-electroconductive surface side. A non-board attachment area of the non-electroconductive surface of the board attachment material is exposed to an outside.

20 Claims, 8 Drawing Sheets

(56) References Cited

U.S. PATENT DOCUMENTS

| | | | |
|---|---|---|---|
| 2009/0168321 A1* | 7/2009 | Kataoka et al. | 361/679.22 |
| 2009/0284693 A1* | 11/2009 | Adachi et al. | 349/98 |
| 2010/0327737 A1* | 12/2010 | Hayashi et al. | 313/504 |
| 2011/0211804 A1 | 9/2011 | Yamamoto et al. | |
| 2012/0188724 A1 | 7/2012 | Masaki | |
| 2013/0070159 A1* | 3/2013 | Ooe | 348/725 |
| 2013/0070160 A1* | 3/2013 | Sumitomo et al. | 348/725 |
| 2013/0201413 A1* | 8/2013 | Nakase | 348/836 |
| 2013/0286295 A1* | 10/2013 | Takahashi et al. | 348/836 |

OTHER PUBLICATIONS

English abstract of Japanese Publication No. 2003-015150 published on Jan. 15, 2003, 1 page.

* cited by examiner

DISPLAY DEVICE AND TELEVISION DEVICE

FIELD OF THE INVENTION

The present invention relates generally to a display device and television device provided with a circuit board(s) mounted on a circuit board mounting material.

BACKGROUND OF THE INVENTION

In the past, display devices with circuit boards mounted on a circuit board mounting material have been known. Such display devices have had disadvantages in that it is difficult to ground the circuit board when the side of the board mounting material whereon the circuit board is attached lacks electroconductivity.

Accordingly, in the past, display devices have been proposed (see for example Cited Patent Document 1) whereby grounding of the circuit board is enabled even when the surface of a board mounting material where the circuit board is mounted does not have electroconductivity, The aforementioned Cited Patent Document 1 discloses an image display device provided with a circuit board mounted on a plastic frame (board mounting material) comprised of plastic resin having electroconductivity. In such an image display device, a special grounding fitting is provided for the purpose of electrically connecting the ground pattern of a circuit board with a metal plate provided on the interior of the image display device, and a circuit board mounted on the board mounting device is grounded through the grounding fitting.

PATENT DOCUMENTS

Cited Patent Document 1: Patent Laid-open 2009-9032

However, an image display device as disclosed in the aforementioned Cited Patent Document 1 has problems in that the number of components is increased by the number of special grounding fittings provided for the purpose of grounding circuit boards.

The present invention has been made for the purpose of resolving problems such as that described above, and one objective of the present invention is to provide a display device and television device whereby grounding of circuit boards is enabled without increasing the number of components, even in cases where the surface of a board mounting material whereon a circuit board is mounted does not have electroconductivity.

BRIEF SUMMARY OF THE INVENTION

In one aspect of the present invention, a display device includes a display part that displays images on a front surface, a board attachment material configured to support the display part from a rear surface that is opposite the front surface of the display part, and a circuit board attached in the board attachment area on the non-electroconductive surface side of the board attachment material. The board attachment material includes a non-electroconductive surface having no electroconductivity placed on the rear surface side, an electroconductive surface having electroconductivity placed on a side opposite to the non-electroconductive surface side, and a board attachment area on the non-electroconductive surface side. A non-board attachment area of the non-electroconductive surface of the board attachment material is exposed to an outside. A first electroconductive part is formed in the board attachment area of the non-electroconductive surface side of the board attachment material by folding back the electroconductive surface of the board attachment material on the non-electroconductive surface side. The circuit board is grounded through the first electroconductive part.

According to one or more embodiments, a first electroconductive area is formed in the board attachment area on the non-electro conductive surface of the board attachment material, by folding back the electroconductive surface of the board attachment material onto the non-electroconductive side, and the circuit board is grounded through the first electroconductive part. By this means it is possible to ground the circuit board through the first electroconductive part formed by folding back the electroconductive surface of the board attachment material on the non-electroconductive side without providing separate specialized parts for the purpose of grounding the circuit board, and therefore it is possible to ground the circuit boards without increasing the number of components.

According to one or more embodiments, the first electroconductive part may be formed by cutting out and folding back the electroconductive surface of the board attachment material onto the non-electroconductive side. By means of this configuration, it is possible to form the first electroconductive part easily, simply by cutting out and folding back the electroconductive surface of the board attachment material onto the non-electroconductive side.

According to one or more embodiments, a cover material may be provided, placed so as to cover the board attachment area of the board attachment material, while exposing the non-board attachment area of the board attachment material. By means of this configuration it is possible to easily ground the circuit board through the first electroconductive part while protecting the circuit board by covering the circuit board with a covering material.

According to one or more embodiments, the circuit board may be grounded by being placed on the electroconductive surface of the first electroconductive part. By means of this configuration it is possible to cause planar contact between the circuit board and first electroconductive part, and thereby to ground the circuit board in a stable manner by means of the first electroconductive part.

According to one or more embodiments, the first electroconductive part may contain a fastening part whereby the circuit board is fastened, by means whereof the circuit board is attached to the board attachment area on the non-electroconductive surface side of the board attachment material, by being fastened to the fastening part of the first electroconductive area by means of a fastening material, in a state whereby the circuit board is positioned on the electroconductive surface of the first electroconductive part. By means of this configuration, it is possible to fasten the circuit board to the fastening part of the first electroconductive part for the purpose of grounding the circuit board, and therefore it is possible to ground the circuit board and attach the board attachment material to the circuit board by means of the first electroconductive part only, without providing separate fastening parts for the purpose of fastening the circuit board.

According to one or more embodiments whereby the aforementioned first electroconductive part contains a fastening part, a plurality of first electroconductive parts containing the fastening part(s) may be provided. By means of this configuration, it is possible to strongly affix the circuit board to the board attachment material by means of a multiplicity of fastening parts provided in the first electroconductive part(s).

According to one or more embodiments whereby the aforementioned circuit board is placed on the electroconductive surface of the first electroconductive part, the first electroconductive part may include positioning part(s) for the purpose of positioning the circuit board when the circuit board is placed on the electroconductive surface of the first electroconductive part. By means of this configuration, it is possible to accurately position the relative positions of the first electroconductive part and circuit board by means of the positioning part(s) of the first electroconductive part, and therefore it is possibly to accurately ground the circuit board through the first electroconductive part.

According to one or more embodiments a shield material may be placed so as to cover the circuit board, whereby a second electroconductive part, formed by folding back the electroconductive surface of the board attachment material on the non-electroconductive surface side, and placed in the board attachment area on the non-electroconductive surface side of the board attachment material. By means of this configuration, it is possible to ground the shield material by means of a second electroconductive part formed by folding back the electroconductive surface of the board attachment material onto the non-electroconductive surface side, without separately providing specialized parts for the purpose of grounding the shield material, and therefore it is possible to ground the shield material without increasing the number of component parts.

According to one or more embodiments, the second electroconductive part may be formed by cutting and folding back the electroconductive surface of the board attachment material to the non-electroconductive surface side. By means of this configuration, it is possible to form the second electroconductive part easily, by simply cutting and folding back the electroconductive surface of the board attachment material to the non-electroconductive surface side.

In another aspect of the present invention, a television device includes a receiving part that receives television broadcasts, a display part that displays images on a front surface, a board attachment material configured to support the display part from a rear surface that is opposite the front surface of the display part, and a circuit board attached in the board attachment area on the non-electroconductive surface side of the board attachment material. The board attachment material includes a non-electroconductive surface having no electroconductivity placed on the rear surface side, an electroconductive surface having electroconductivity placed on a side opposite to the non-electroconductive surface side, and a board attachment area on the non-electroconductive surface side. A non-board attachment area of the non-electro conductive surface of the board attachment material is exposed to an outside. A first electroconductive part is formed in the board attachment area of the non-electroconductive surface side of the board attachment material by folding back the electroconductive surface of the board attachment material on the non-electroconductive surface side. The circuit board is grounded through the first electroconductive part.

According to one or more embodiments, a first electroconductive part is formed in the board attachment area on the non-conductive surface side of the board attachment material, by folding back the electroconductive surface of the board attachment material onto the non-electroconductive surface side, and the circuit board is grounded through the first electroconductive part. By this means, it is possible to ground the circuit board through the first electroconductive part formed by folding back the electroconductive surface side of the board attachment material to the non-electroconductive surface side, and therefore it is possible to provide a television device whereby it is possible to ground the circuit board without increasing the number of component parts.

According to one or more embodiments, it is possible to ground a circuit board without increasing the number of component parts, even in cases whereby the surface of the side of the board attachment material whereon the board is mounted does not have electroconductivity.

DETAILED DESCRIPTION OF THE INVENTION

Next we describe embodiments of the present invention on the basis of the Drawings.

First Embodiment

First we describe the configuration of liquid crystal television device 100 according to the first embodiment of the present invention, with reference to FIG. 1 through FIG. 7. The liquid crystal television device 100 is one example of a "display device" and a "television device" according to the present invention.

Figure 1:
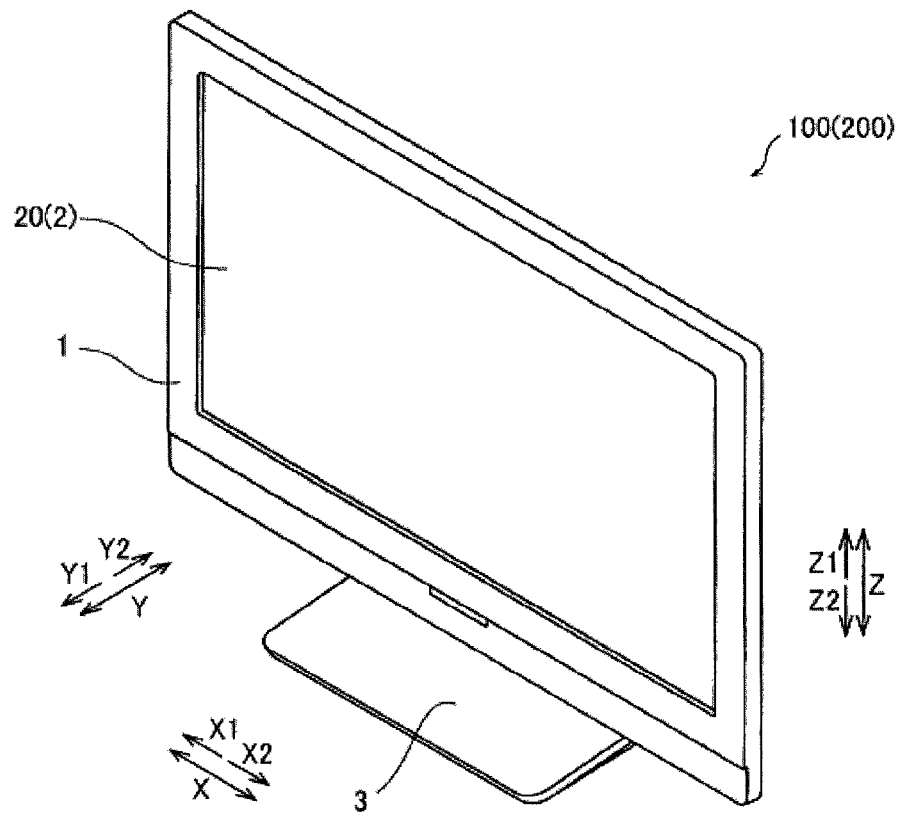
FIG. 1 is an oblique view seen from the side of the front surface of a liquid crystal television device according to the first embodiment of the present invention.
Figure 2:
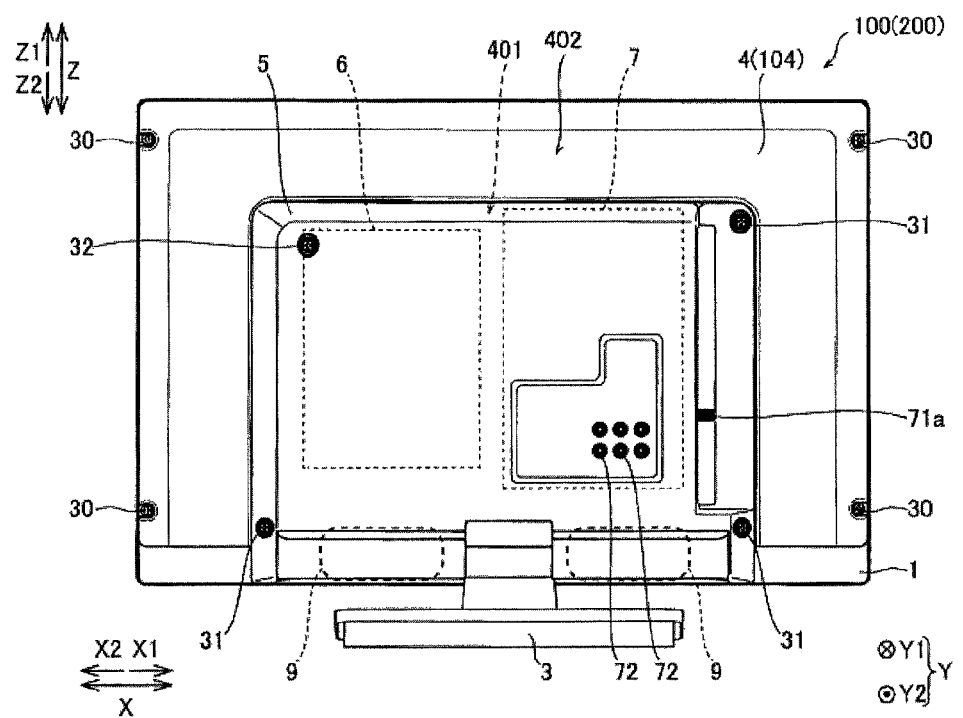
FIG. 2 is a rear view of a liquid crystal television device according to the first embodiment of the present invention.
Figure 3:
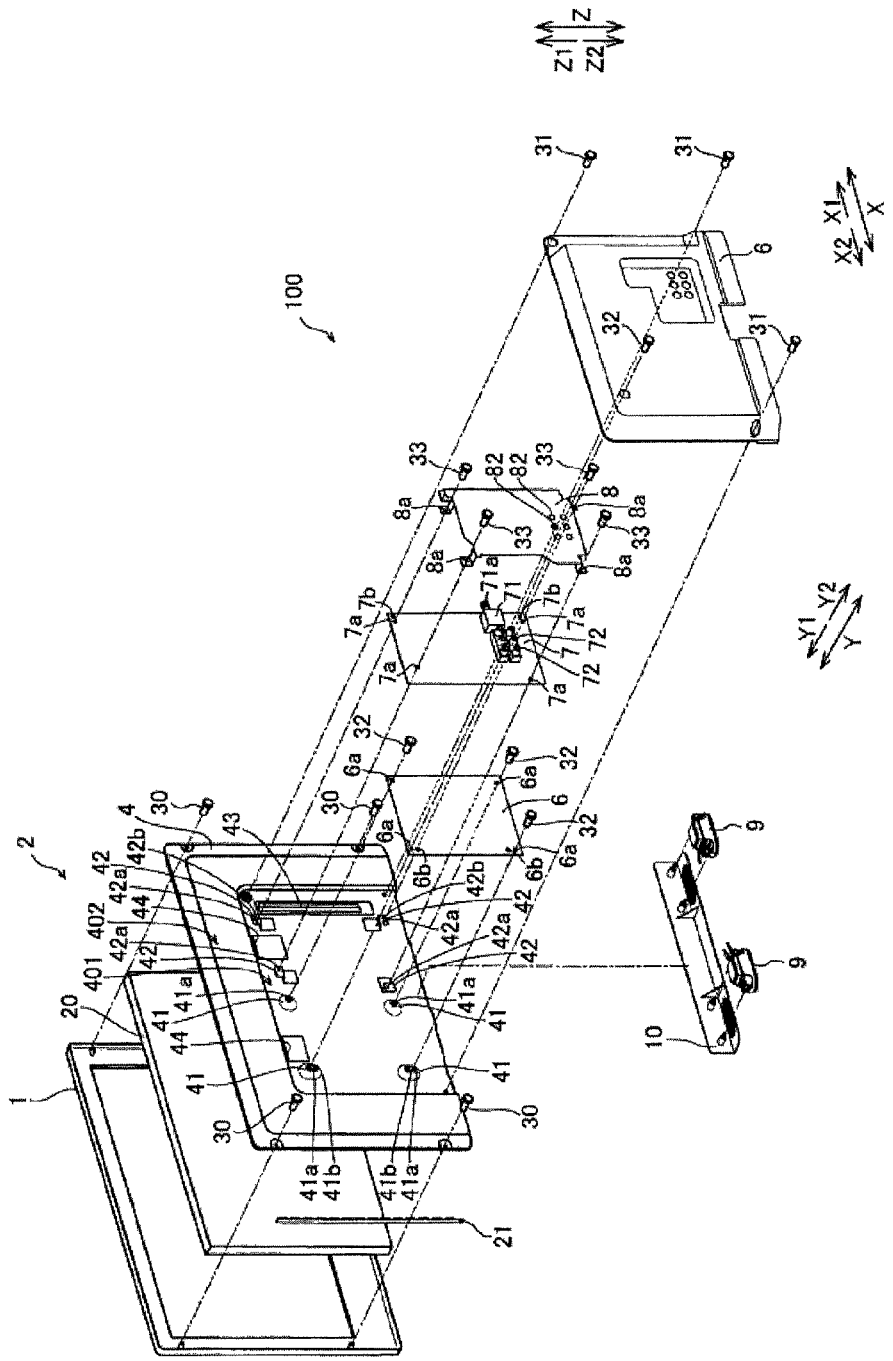
FIG. 3 is an exploded oblique view of a liquid crystal television device according to the first embodiment of the present invention.

As shown in FIG. 1 through FIG. 3, liquid crystal television device 100 is comprised of front chassis 1 formed in the shape of a frame and having an approximately rectangular shape viewed from the front surface side (the side in the direction of arrow Y1), and a display panel 2 having a display part 20 comprised of liquid crystal cells, and a stand material 3 supporting the entirety of liquid crystal television device 100 from below (the side in the direction of arrow Z2). The front chassis 1 and stand material 3 are both made of plastic resin.

As shown in FIG. 2 and FIG. 3, rear frame 4 made of sheet metal is placed at the rear surface side (the side in the direction of arrow Y2) of front chassis 1, and supports display part 20 from the rear surface side. The rear frame 4 is constructed of SECC (Steel, Electrically Chromate Coated) etc. Also, rear frame 4 is formed so as to be in an approximately rectangular shape, smaller than front chassis 1 as viewed from the rear surface side. The rear frame 4 is one example of a "board attachment material" according to the present invention.

As shown in FIG. 3, a light reflecting sheet (not shown), light conducting panel (not shown), display part 20, and light source 21 comprised of LEDs (light emitting diodes) etc. are placed at the rear surface side (the side in the direction of arrow Y2) of front chassis 1 and at the front surface side (the side in the direction of arrow Y1) of rear frame 4. Thus, display panel 2 is comprised of the aforementioned constituent elements not shown, display part 20, light source 21, and rear frame 4 etc. The front chassis 1 and rear frame 4 are affixed (fastened) to each other by means of screw materials 30.

Also, as shown in FIG. 2 and FIG. 3, cover material 5 made of resin is placed on the rear surface side (the side in the direction of arrow Y2) of rear frame 4. Cover material 5 is formed so as to have an approximately rectangular shape, smaller than front chassis 1 and rear frame 4 as viewed from the rear surface side. The rear frame 4 and cover material 5 are affixed (fastened) to each other by means of screw materials 31 and 32.

As shown in FIG. 2, cover material 5 is placed so as to cover area 401 in the vicinity of the center of the rear surface (the surface in the direction of arrow Y2) of rear frame 4, and also cause area 402 in the vicinity of the periphery of the rear surface of rear frame 4 to be exposed in an inverse U shape. Thus, a rear chassis corresponding to front chassis 1 is configured from cover material 5 and area 402 exposed in an inverse U shape in the vicinity of the periphery of the rear surface of rear frame 4. The area 401 covered by cover material 5 in the vicinity of the central part of rear surface of rear frame 4 is one example of a "board attachment area" according to the present invention. Also, area 402, exposed in an inverse U shape in the vicinity of the periphery of the rear surface of rear frame 4, is one example of a non-board attachment area" according to the present invention.

In the first embodiment, because one part (area 402) of the rear surface (the surface on the side in the direction of arrow Y2) of rear frame 4 comprising the rear chassis is an externally visible component, the rear surface of rear frame 4 is coated with a coating that does not have electroconductivity in order to improve appearance. By this means, the rear surface of rear frame 4 forms a non-electroconductive surface having no electroconductivity. The front surface (the side in the direction of arrow Y1) of rear frame 4 is not coated because, unlike the rear surface of rear frame 4, it does not affect external appearance. As a result the front surface of rear frame 4 comprises an electroconductive surface having electroconductivity.

Figure 4:
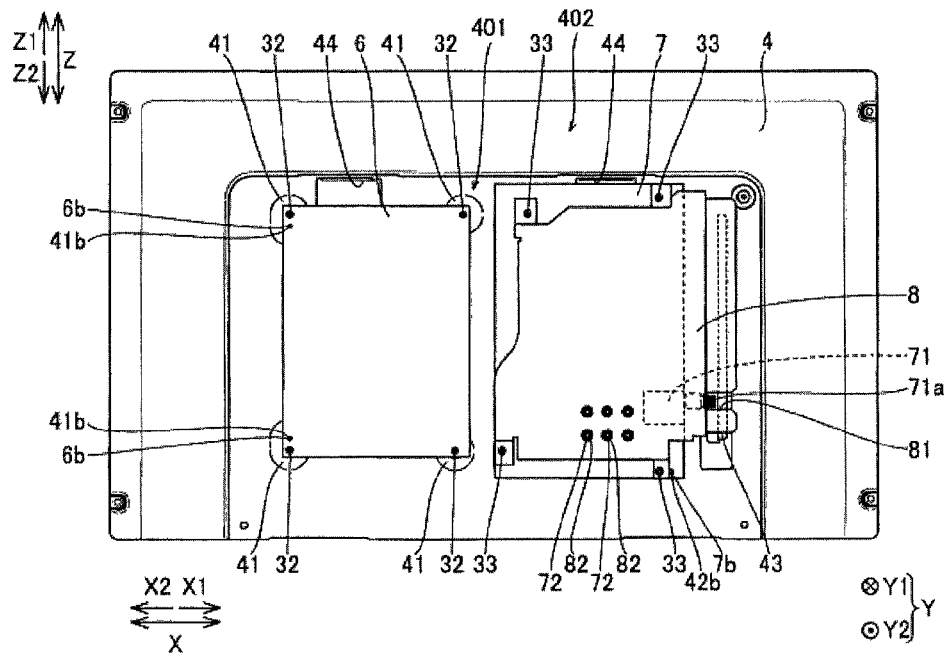
FIG. 4 is a rear view showing a power supply board, signal processing board, and shield material attached to the frame of a liquid crystal television device according to the first embodiment of the present invention.

As shown in FIG. 2 through FIG. 4, on the coated rear side (the non-electroconductive surface side in the direction of arrow Y2) of rear frame 4 are placed power supply board 6, signal processing board 7, and shield part 8 make of sheet metal and covering signal processing board 7, as well as two speakers 9. Also, as shown in FIG. 3 and FIG. 4, on signal processing board 7 are placed tuner 71 having connecting terminal 71a connected to antenna 101 described below (see FIG. 5), and a multiplicity of external connecting terminals 72. The tuner 71 is one example of a "receiving part" according to the present invention.

As shown in FIG. 2 through FIG. 4, power supply board 6 and signal processing board 7 are placed in a row in the left-right direction (X direction) on area 401 in the vicinity of the center part of the coated rear surface (non-electroconductive surface in the direction of arrow Y2) of rear frame 4. Also, as shown in FIG. 2 and FIG. 3, the two speakers 9 are placed in a row in the left-right direction below (in the direction of arrow Z) power supply board 6 and signal processing board 7, in a state of attachment to speaker attachment material 10 (see FIG. 3).

Figure 5:
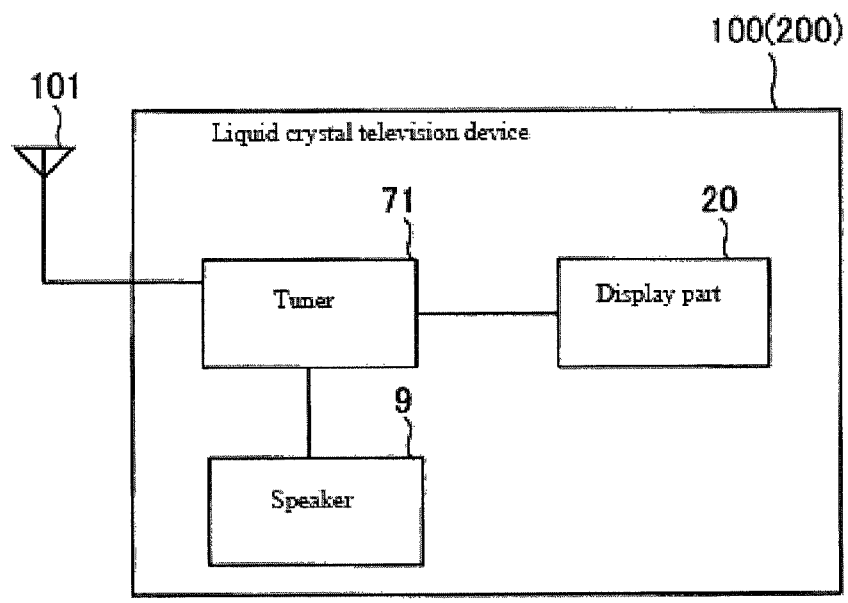
FIG. 5 is a block diagram of a liquid crystal television device according to the first embodiment of the present invention.

Power supply board 6 is provided for the purpose of supplying electrical power to the entirety of liquid crystal television device 100. Also, signal processing board 7 is provided for the purpose of performing signal processing of video signals and audio signals of television broadcasts received by tuner 71. As shown in FIG. 5, tuner 71 of signal processing board 7 is connected to antenna 101 for the purpose of receiving television broadcasts, as well as to display part 20, and speakers 9. By this means, signal processing board 7 is configured to output the video signals to display part 20 and the audio signals to speakers 9, of the video and audio signals of television broadcasts received by tuner 71 through antenna 101.

Figure 6:
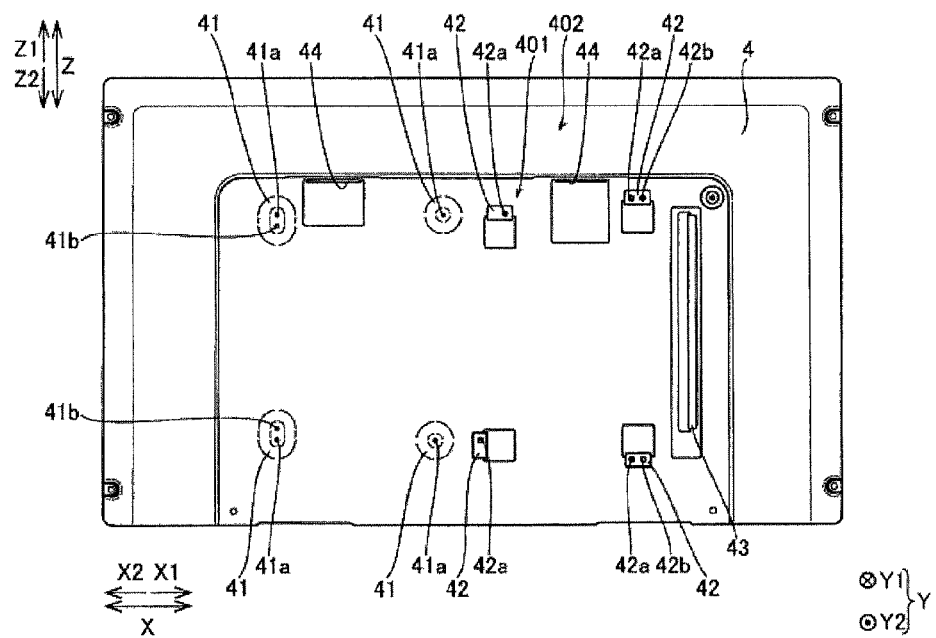
FIG. 6 is a back view of the rear frame of a liquid crystal television device according to the first embodiment of the present invention.

As shown in FIG. 3 and FIG. 6, power supply board attachment parts 41 for attaching power supply board 6, and signal processing board attachment part 42 for attaching signal processing board 7, are provided in coated area 401 in the vicinity of the central part of the rear surface (non-electroconductive surface in the direction of arrow Y2) of rear frame 4. Four power supply board attachment parts 41 are placed in an area on the left side (the side in the direction of arrow X2) of area 401 in the vicinity of the central part of the rear surface of rear frame 4. Also, four signal processing board attachment parts 42 are placed in an area on the right side (the side in the direction of arrow X1) of area 401 in the vicinity of the central part of the rear surface of rear frame 4. The signal processing board attachment part(s) 42 are one example of a "first electroconductive part" according to the present invention.

As shown in FIG. 3, each of the four power supply board attachment parts 41 are formed so as to have raised shapes protruding from the coated rear surface (non-electroconductive surface on the side in the direction of arrow Y2) of rear frame 4 towards the side (side towards arrow Y2) of power supply board 6. Also, each of the four power supply board attachment parts 41 are formed as one unit with rear frame 4 by press forming etc. As shown in FIG. 3 and FIG. 6, the four power supply board attachment parts 41 are provided with screw holes 41a mating with screw materials 32. And as shown in FIG. 3, screw insertion holes 6a, corresponding to screw holes 41a in power supply attachment parts 41, are placed in the vicinity of the periphery of power supply board 6. By this means, power supply board attachment parts 41 and power supply boards 6 are affixed (fastened) together by means of screw materials 32.

In addition, as shown in FIG. 3, FIG. 4, and FIG. 6, positioning parts 41b comprised of raised parts protruding towards the side of power supply board 6 (the direction of arrow Y2) are placed respectively in the vicinity of screw holes 41a of the two power supply board attachment parts 41 placed on the left side (the side in the direction of arrow X2) among the aforementioned four power supply board attachment parts 41. Also, two positioning holes 6b corresponding to the aforementioned two positioning parts 41b are placed on power supply board 6. By this means, positioning parts 41b of power supply board attachment part 41 are made to fit with positioning holes 6b of power supply board 6, and thereby positioning of power supply board 6 is accomplished when power supply attachment part 41 and power supply board 6 are fastened by means of screw materials 32.

Figure 7:
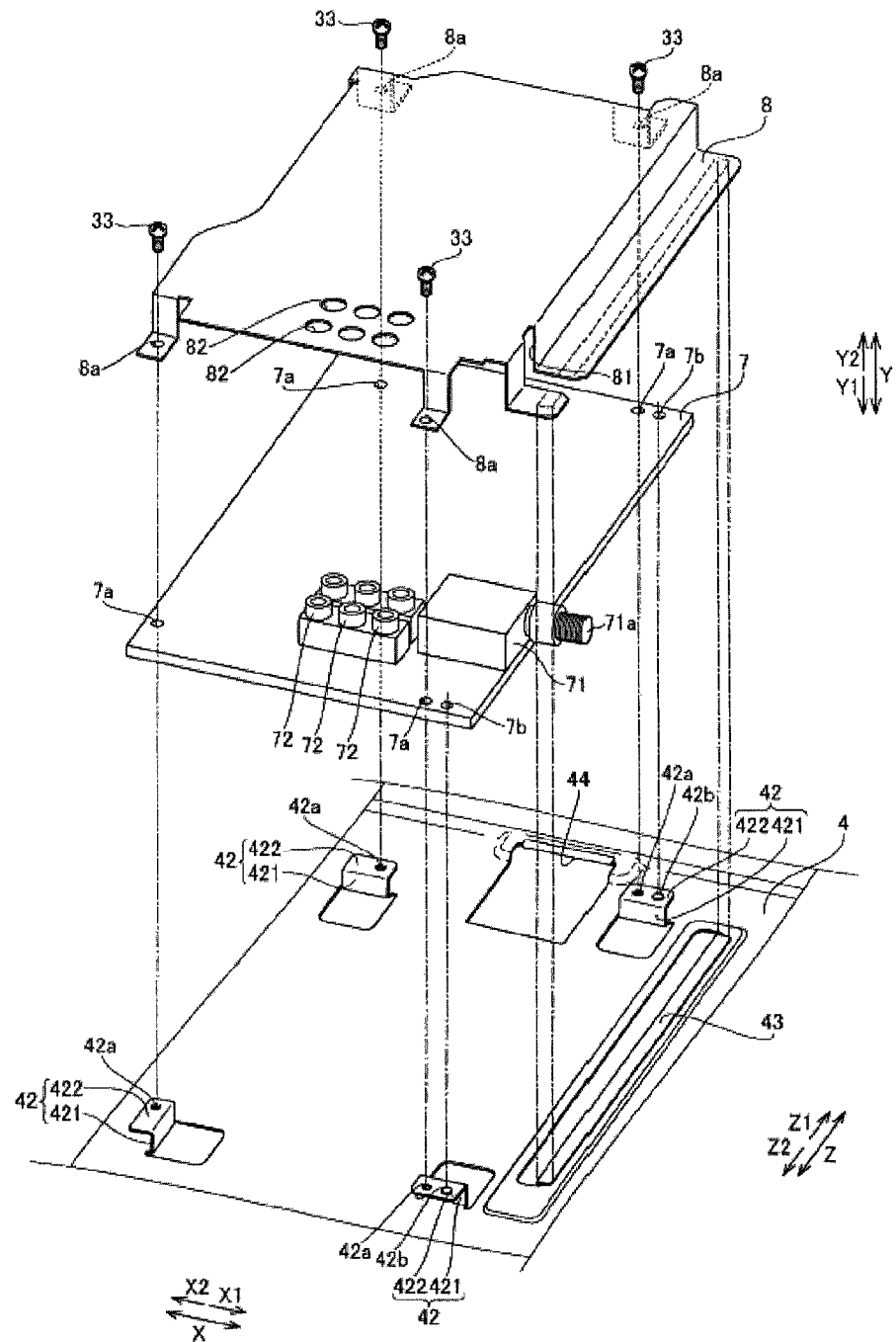
FIG. 7 is an exploded oblique view for the purpose of describing the order of attachment of a signal processing board and shield material to a signal processing board attachment part of a rear frame of a liquid crystal television device according to the first embodiment of the present invention.

As shown in FIG. 3 and FIG. 7, each of the four signal processing attachment parts 42 are shaped so as to protrude from coated rear surface (non-electroconductive surface on the side in the direction of arrow Y2) of rear frame 4 towards the side of signal processing board 7 (the side in the direction of arrow Y2). Also, each of the four signal processing board attachment parts 42 is formed as one unit with rear frame 4. Namely, each of the four signal processing board attachment parts 42 is formed by cutting out uncoated front surface (electroconductive surface on the side in the direction of arrow Y1) of the front surface of rear frame 4, and folding it back on the rear surface side. Specifically, as shown in FIG. 7, signal processing board attachment part 42 is formed so as to have first part 421 extending along a plane perpendicular to rear frame 4 (the X-y plane or Y-Z plane), and second part 422 extending along a plane parallel to rear frame 4 (the X-Z plane).

Further, as shown in FIG. 3, FIG. 4, FIG. 6, and FIG. 7, screw holes 42a mating with screw materials 33 are placed on the surface (uncoated electroconductive surface) of second part 422 of signal processing board attachment part 42 that is toward the side of signal processing board 7 (the side in the direction of arrow Y2). Also, screw insertion holes 7a corresponding to screw holes 42a in board attachment part 44 are formed in the vicinity of the periphery of signal processing board 7 as shown in FIG. 3 and FIG. 7. By this means, signal processing board attachment areas 42 and signal processing board 7 are affixed (fastened) together by means of screw materials 33. The screw holes 42a are one example of a "fastening part" according to the present invention. Also, screw materials 33 are one example of a "fastening material" according to the present invention.

In addition, as shown in FIG. 3, FIG. 4, FIG. 6, and FIG. 7, positioning parts 42b protruding towards the side of signal processing board 7 (the side in the direction of arrow Y2), in the vicinity of screw holes 42a of the two signal processing board attachment parts 42 located on the right side (the side in the direction of arrow X1) among the aforementioned four signal processing board attachment parts 42. Also, as shown in FIG. 3, FIG. 4, and FIG. 7, positioning holes 7b are placed in signal processing board 7, corresponding to the aforementioned two positioning parts 42b. By this means positioning of signal processing board is accomplished during fastening of signal processing board attachment part 42 and signal processing board 7, by mating of positioning part 42b of signal processing board attachment part 42 with positioning hole 7b of signal processing board 7.

Here, signal processing board attachment part 42 is placed so as to correspond to a grand pattern, not shown, formed on the surface of signal processing board(s) 7 that is towards rear frame 4 (the surface on the side in the direction of arrow Y1). By this means, signal processing board 7 is configured so as to be grounded through second part 422 of signal processing board attachment part 42, by means of the fact that when signal processing board attachment part 42 and signal processing board 7 are attached by means of screw materials 33, signal processing board 7 is placed in a state of planar contact on the surface (uncoated electroconductive surface) of the signal processing board 7 side (the side in the direction of arrow Y2) of second part 422 of signal processing board attachment part 42.

Also, as shown in FIG. 3, FIG. 4, and FIG. 7, signal processing board attachment part 42 has not only signal processing board 7 but also shield material 8, which covers signal processing board 7, affixed (fastened) thereto by screw materials 31. Specifically, four screw penetration holes 8a, corresponding to screw holes 42a of signal processing board, are placed in shield material 8. By means thereof, shield material 8 and signal processing board 7 are both fastened by means of screw materials 33 into holes 42a of signal processing board attachment part 42. In the shield material 8 are placed cutout part 81 for the purpose of exposing connecting terminal 71a of tuner 71 of signal processing board 7, and hole parts 82 for the purpose of exposing external connection terminals 72 of signal processing board 7.

In addition, as shown in FIG. 3, FIG. 4, FIG. 6, and FIG. 7, folded back part 43 extending in the up-down direction (Z direction) is formed in the vicinity of the end on the right side (the side in the direction of arrow X1) of area 401 on the coated rear surface (non-electro conductive surface on the side in the direction of arrow Y2) of rear frame 4. The folded back part 43 is formed by cutting out the uncoated front surface (electroconductive surface on the side in the direction of arrow Y1) of rear frame 4, and folding it back onto the rear side (the side in the direction of arrow Y2).

Here, as shown in FIG. 4 and FIG. 7, the folded surface (uncoated electroconductive surface) of folded back part 43 is configured such that, when attached to rear frame 4 so that shield part 8 covers signal processing board 7, it contacts the surface (surface on the side in the direction of arrow Y1) of shield material 8 on the side of rear frame 4 in a state of planar contact. By this means, shield material 8 is configured so as to be grounded through the folded side of folded back part 43 when shield material 8 is attached so as to cover signal processing board 7. The folded back part 43 is one example of a "second electroconductive part" according to the present invention.

As shown in FIG. 4 and FIG. 7, two hole parts 44 are placed along the left-right direction (X direction) to allow passage of connecting wiring (not shown) connecting power supply board 6 and signal processing board 7, in the area in the vicinity of the end of the upper side (the side in the direction of arrow Z1) of area 401 in the vicinity of the central part of the rear surface (non-electroconductive surface on the side in the direction of arrow Y2) of rear frame 4.

In the first embodiment, as described above, signal processing board attachment part 42 is provided in area 401 on the rear surface (non-electroconductive surface on the side in the direction of arrow Y2) of rear frame 4 and is formed by folding back the uncoated front surface (electroconductive surface on the side in the direction of arrow Y1) of rear frame 4 onto the rear surface side thereof, and thereby signal processing board 7 is grounded through signal processing board attachment part 42. By this means, it is possible to ground signal processing board 7 through signal processing board attachment part 42, by folding back the front surface of rear frame 4 onto the rear side, without separately providing specialized parts for the purpose of grounding signal processing board 7, and thereby it is possible to ground signal processing board 7 without increasing the number of components.

Also, in the first embodiment, as described above, signal processing board attachment part 42 is formed by cutting out and folding over the uncoated front surface (electroconductive surface on the side in the direction of arrow Y1) of rear frame 4 onto the rear surface (non-electroconductive surface on the side in the direction of arrow Y2). By this means, it is possible to form signal processing board attachment part 42 easily, by simply cutting out and folding back the rear side of rear frame 4 onto the front surface.

In addition, in the first embodiment, as described above, cover material 5 is provided covering area 401 in the vicinity of the central part of rear frame 4 while also exposing area 402 in the vicinity of the periphery of rear frame 4, and grounding signal processing board 7 through signal processing board attachment part 42 while signal processing board 7 is covered by cover material 5. By this means it is possible to ground signal processing board 7 through signal processing board attachment part 42 easily, while protecting signal processing board 7 by covering signal processing board 7 with cover material 5.

Also, in the first embodiment, as described above, signal processing board 7 is grounded by being placed on the surface (uncoated electroconductive surface) of the side of second part 422 of signal processing board attachment part 42 towards signal processing board 7 (the side in the direction of arrow Y2). By this means it is possible to cause planar contact between signal processing board 7 and signal processing board attachment part 42, and therefore it is possible to ground signal processing board 7 in a stable manner by means of signal processing board attachment part 42.

In addition, in the first embodiment, as described above, screw holes 42a are provided in signal processing board attachment part 42 whereby signal processing board 7 is fastened. Also, signal processing board is attached to area 401 on the side of the coated surface (non-electroconductive surface on the side in the direction of arrow Y2) of rear frame 4 by fastening signal processing board 7 to screw holes 42a of signal processing board attachment part 42 using screw materials 33, in a state whereby signal processing board 7 is placed on the surface (uncoated electroconductive surface) of second part 422 of signal processing board attachment part 42 on the side of signal processing board 7 (the side in the direction of arrow Y2). By this means, it is possible to fasten signal processing board 7 to screw holes 42a of signal processing board attachment part 42 for the purpose of grounding signal processing board 7, and therefore it is possible to ground signal processing board 7 and also attach signal processing board 7 to rear frame 4 by means of signal processing board attachment part 42 alone, without providing separate screw holes 42a for the purpose of fastening signal processing board 7.

Further, in the first embodiment, as described above, four signal processing board attachment parts 42 including screw holes 42a are provided. By this means it is possible to strongly affix signal processing board 7 to frame 4 by means of four screw hoes 42a placed in four signal processing board attachment parts 42.

Also, in the first embodiment, as described above, positioning parts 42b are provided in signal processing board attachment part 42, for the purpose of positioning signal processing board 7 during placement of signal processing board 7 on the surface (uncoated electroconductive surface) of second part 422 of signal processing board 42 toward the side of signal processing board 7 (the side in the direction of arrow Y2). By so doing, it is possible to accurately determine the relative positions of signal processing board attachment part 42 and signal processing board 7 by means of positioning parts 42b of signal processing board attachment part 42, and thereby it is possible to accurately ground signal processing board 7 through signal processing board attachment part 42.

In addition, in the first embodiment, as described above, shield material 9 covering signal processing board 7 is provided, and also folded back part 43 is provided, being formed by folding back the uncoated front surface (electroconductive surface on the side in the direction of arrow Y1) of rear frame 4 onto the rear side, in area 401 on the side of rear frame 4 towards the side of the coated rear surface (non-electroconductive surface on the side in the direction of arrow Y2), and shielding material 9 is grounded through folded back part 43. By this means, it is possible to ground shielding material 9 by means of folded back part 43 formed by folding back the front surface of rear frame 4 onto the rear side, without providing separate specialized parts for the purpose of grounding shielding material 9, and therefore it is possible to ground shielding material 9 without increasing the number of components.

Further, in the first embodiment, as described above, folded back part 43 is formed by folding back the uncoated front surface (electroconductive surface on the side in the direction of arrow Y1) of rear frame 4 onto the coated rear surface (non-electroconductive surface on the side in the direction of arrow Y2). By this means it is possible to form folded back part 43 easily, simply by cutting out and folding back the front surface of rear frame 4 onto the rear side.

Second Embodiment

Next we describe signal processing board attachment part 142 of rear frame 104 of liquid crystal television device 200 according to a second embodiment of the present invention, with reference to FIG. 1, FIG. 2, FIG. 5, FIG. 8, and FIG. 9. This second embodiment is described in terms of an example that differs from the aforementioned first embodiment in that signal processing board attachment part 42 has first part 421 that extends along a plane perpendicular to rear frame 4 (X-Y plane or Y-Z plane), and in that signal processing board attachment part 142 does not have a part extending along a plane perpendicular to rear frame 4 (X-Y plane or Y-Z plane).

Figure 8:
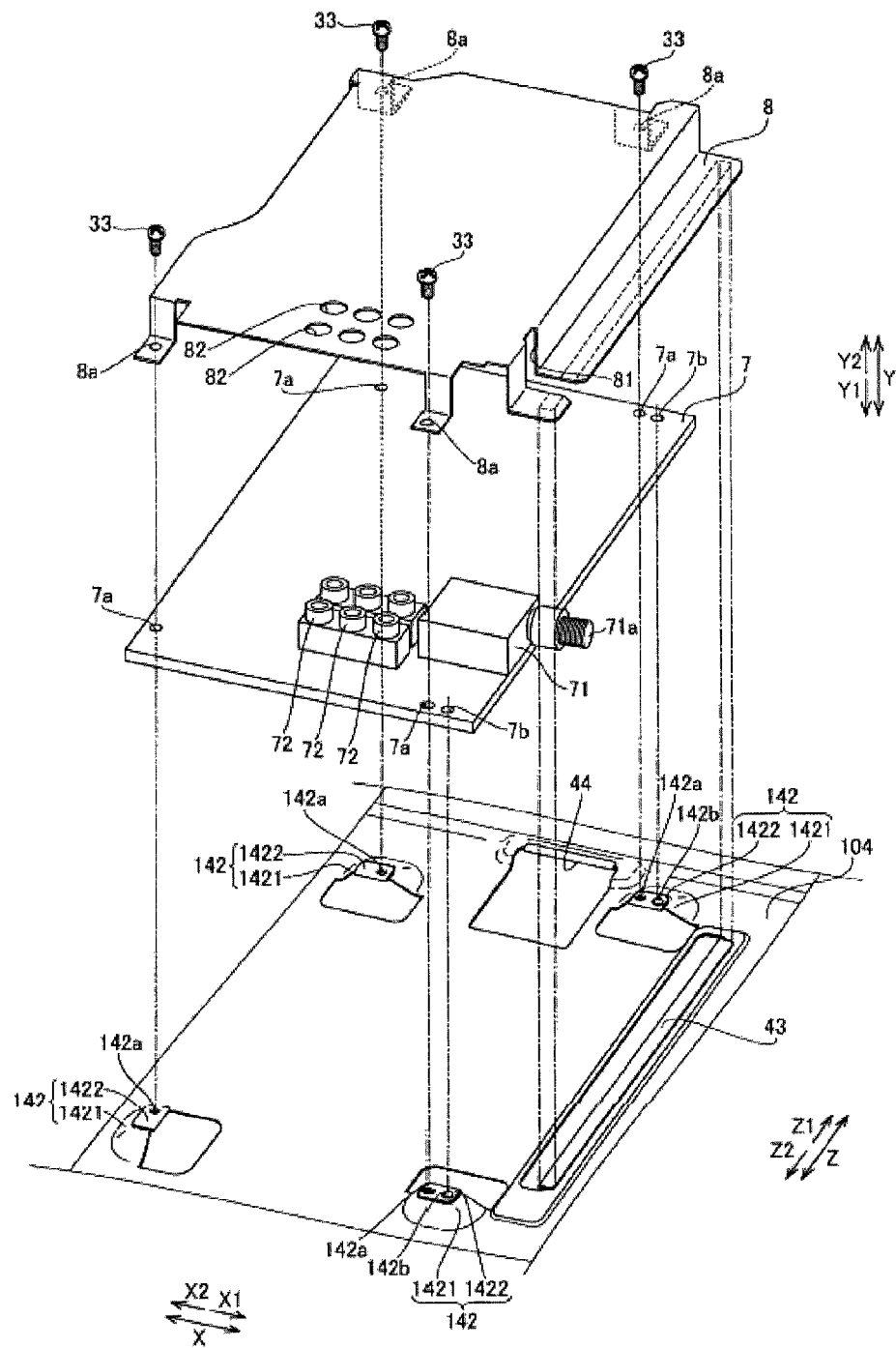
FIG. 8 is an exploded oblique view for the purpose of describing the order of attachment of signal processing board (s) to a signal processing board attachment part of a rear frame of a liquid crystal television device according to the second embodiment of the present invention.
Figure 9:
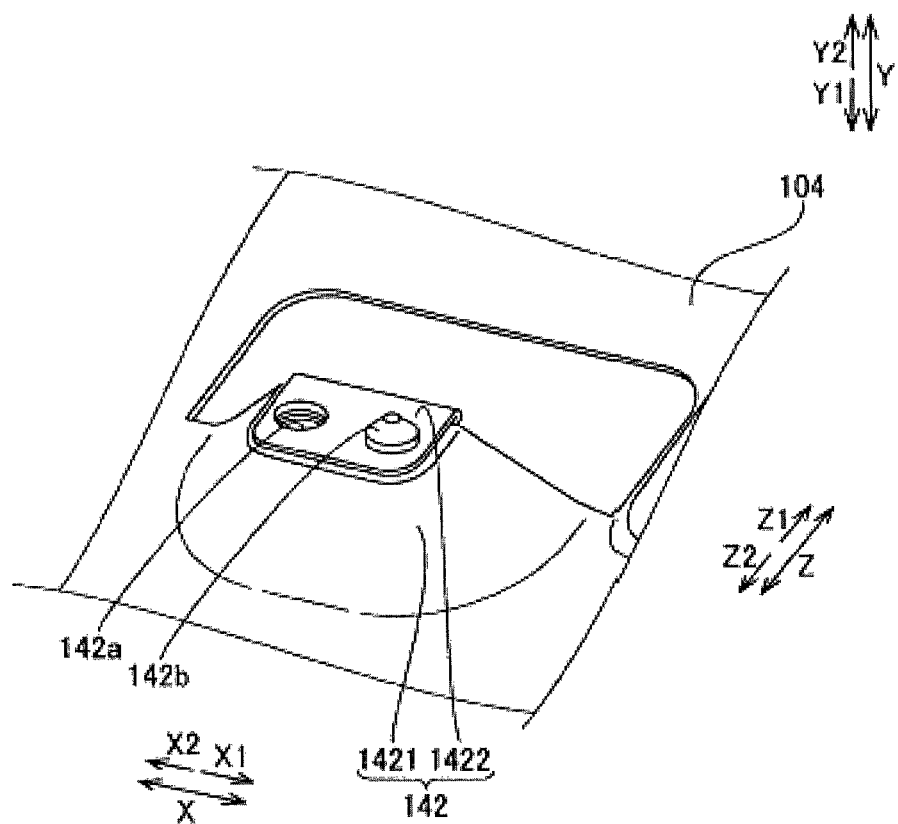
FIG. 9 is a partial enlarged view showing an enlargement of one of the four signal processing board attachment areas shown in FIG. 8, positioned on the side in the direction of arrow X1 and on the side in the direction of arrow Z2.

In liquid crystal television device 200 according to the second embodiment (see FIG. 1, FIG. 2, and FIG. 5), as shown in FIG. 8 and FIG. 9, four signal processing board attachment parts 142 for the purpose of attaching signal processing board(s) 7 are placed on the coated rear surface (non-conductive surface on the side in the direction of arrow Y2) of rear frame 104. The liquid crystal television device 200 is one example of a "display device" and a "television device" according to the present invention. Also, rear frame 104 is one example of a "board attachment material" according to the present invention. And signal processing board attachment part 142 is one example of a "first electroconductive part" according to the present invention.

As shown in FIG. 8 and FIG. 9, the four signal processing board attachment parts 142 are each formed as one unit with rear frame 104 by application of press forming (compression forming) of the coated rear surface (non-electroconductive surface on the side in the direction of arrow Y2) of rear frame 104. Specifically, each of the four signal processing board attachment parts 142 is formed so as to contain a protruding part 1421 comprised of a pressed part protruding from the rear surface of the rear frame towards the side of signal processing board 7 (the side in the direction of arrow Y2), and a folded back part 1422 formed by cutting out the uncoated front surface of protruding part 1421 (electroconductive surface on the side in the direction of arrow Y1) and folding it back onto the rear side (the side in the direction of arrow Y2). The folded back part 1422 is formed so as to extend along a plane parallel to rear frame 104 (the X-Z plane) and not to have parts that extend along planes perpendicular to rear frame 104 (X-Y plane or Y-Z plane).

Also, as shown in FIG. 8 and FIG. 9, screw holes 142a are formed so as to mate with screw materials 33 inserted through insertion holes 7a in signal processing board 7, on the surface (uncoated electroconductive surface) of the side (the side in the direction of arrow Y2) of cutout part 1422 of signal processing board attachment part 142. The screw holes 142a are one example of a "fastening part" according to the present invention. Also, screw material 33 is one example of a "fastening material" according to the present invention.

Signal processing board attachment part 142 is placed in a position that corresponds with a grand pattern, not shown, formed on the plane of signal processing board 7 on the side toward rear frame 104 (the plane on the side in the direction of arrow Y1). By this means, when signal processing board attachment part 142 and signal processing board 7 are fastened by screw materials 33, signal processing board 7 is grounded through folded back part 1422 of signal processing board attachment part 142, by being placed in a state of planar contact on the surface (uncoated electroconductive surface) of folded back part 1422 of signal processing board attachment part 142 towards signal processing board 7 (the side in the direction of arrow Y2).

As shown in FIG. 8 and FIG. 9, of the four signal processing board attachment parts 142, each of the screw holes 142a of the two signal processing board attachment parts 142 placed on the right side has positioning parts 142b placed near to and protruding on the side of signal processing board 7 (the side in the direction of arrow Y2). The positioning parts 142b are placed so as to correspond to positioning holes 7b in signal processing board 7, By this means, positioning of signal processing board 7 is accomplished when signal processing board attachment part 142 and signal processing board 7 are fastened by screw materials 33, by fitting positioning parts 142b of signal processing board attachment part 142 with positioning holes 7b of signal processing board 7.

The configuration of the second embodiment may otherwise be the same as in the aforementioned first embodiment.

In addition, the effect of the second embodiment may be the same as in the aforementioned first embodiment.

The embodiments disclosed herein should be understood as being examples in all respects and are not limiting. The scope of the present invention is described not in the aforementioned description of embodiments but in the Scope of Claim for Patent, and further incorporates all modifications within the meaning and scope consistent with the Scope of Claim for Patent.

For example, in the aforementioned first and second embodiments the present invention is described as a display device in terms of an example of application to a liquid crystal television device, however the present invention is not limited thereto. The present invention could be applied to other display devices such as a monitor for a personal computer (PC).

Also, in the aforementioned first and second embodiments, examples are described whereby a signal processing board attachment part (first electroconductive part) is formed by folding back the uncoated front surface (electroconductive surface) of the rear frame (board attachment material) onto the coated rear side (non-electroconductive side) thereof, and whereby of two circuit boards (power supply board and signal processing board), only the signal processing board is grounded through the signal processing board attachment part, however the present invention is not limited thereto. In the present invention not only the signal processing board attachment part, but also the power supply board attachment may be formed by folding back the uncoated front surface of the rear frame onto the coated rear side, and both the signal processing board and power supply board may be grounded respectively through the signal processing board attachment part and power supply board attachment part.

In addition, in the aforementioned first and second embodiments, examples are described whereby a signal processing board (circuit board) is attached to a signal processing board attachment part (first electroconductive part) placed in an area in the vicinity of the central part of a rear frame (board attachment material), however the present invention is not limited thereto. In the present invention, it is also possible to attach a signal processing board to a signal processing board attachment part placed in an area other than the vicinity of the center of the rear frame (such as an area in the vicinity of the periphery).

Also, in the aforementioned first and second embodiments, examples are described whereby a signal processing board (circuit board) is attached to a signal processing board attachment part (first electroconductive part) using screw materials (fastening materials), however the present invention is not limited thereto. In the present invention, it is also possible to attach a signal processing board to a signal processing board attachment part using fastening materials other than screw materials (such as clinching materials), and it is also possible attach a signal processing board to a signal processing board attachment part using materials other than fastening materials (such as adhesive with electroconductive properties).

In addition, in the aforementioned first and second embodiments, examples are described whereby four signal processing board attachment parts (first electroconductive parts) are provided, however the present invention is not limited thereto. In the present invention, the number of signal processing board attachment parts may be 3 or less, or may be 5 or more.

EXPLANATION OF SYMBOLS

2 . . . display panel
4, 104 . . . rear frame (board attachment material)
5 . . . cover material
8 . . . shield material
33 . . . screw material (fastening material)
42, 142 . . . signal processing board attachment part (first electroconductive part)
42a, 142a . . . screw hole (fastening part)
42b, 142b . . . positioning part
43 . . . folded back part (second electroconductive part)
71 . . . tuner (receiving part)
100, 200 . . . liquid crystal television device (display device)
401 . . . area (board attachment area)
402 . . . area (non-board attachment area)

What is claimed is:

1. A display device comprising:
a display panel;
a board attachment comprising:
   a first surface having electroconductivity placed on a side opposite to the display panel; and
   a second surface having no electroconductivity;
a circuit board placed on a second surface side of the board attachment; and
a first electroconductive part formed by folding back the first surface of the board attachment on the second surface side, wherein
the circuit board is grounded through the first electroconductive part.

2. The display device according to claim 1, wherein the first electroconductive part is formed by cutting out the first surface of the board attachment onto the second surface side.

3. The display device according to claim 2, further comprising a cover placed so as to cover a board attachment area on the second surface side of the board attachment and to expose a non-board attachment area on the second surface side of the board attachment, wherein the circuit board is grounded through the first electroconductive part while being covered by the cover.

4. The display device according to claim 2, wherein the circuit board is grounded by being placed on the first surface of the first electroconductive part.

5. The display device according to claim 2, further comprising;
 a shield placed so as to cover the circuit board; and
 a second electroconductive part formed in a board attachment area of the second surface side of the board attachment by folding back the first surface of the board attachment on the second surface side, wherein
 the shield is grounded through the second electroconductive part.

6. The display device according to claim 1, further comprising a cover placed so as to cover a board attachment area on the second surface side of the board attachment and to expose a non-board attachment area on the second surface side of the board attachment, wherein the circuit board is grounded through the first electroconductive part while being covered by the cover.

7. The display device according to claim 6, wherein the circuit board is grounded by being placed on the first surface of the first electroconductive part.

8. The display device according to claim 6, further comprising:
 a shield placed so as to cover the circuit board; and
 a second electroconductive part formed in the board attachment area of the second surface side of the board attachment by folding back the first surface of the board attachment on the second surface side, wherein
 the shield is grounded through the second electroconductive part.

9. The display device according to claim 1, wherein the circuit board is grounded by being placed on the first surface of the first electroconductive part.

10. The display device according to claim 9, wherein
 the first electroconductive part includes a fastening part fastened to the circuit board, and
 the circuit board placed on the first surface of the first electroconductive part is attached to a board attachment area on the second surface side of the board attachment by being fastened by the fastening part of the first electroconductive part with a fastening material.

11. The display device according to claim 10, further comprising a plurality of first electroconductive parts, each of the first electroconductive parts including a fastening part.

12. The display device according to claim 11, wherein the first electroconductive part includes a positioning part that positions the circuit board when the circuit board is placed on the first surface of the first electroconductive part.

13. The display device according to claim 11, further comprising:
 a shield placed so as to cover the circuit board; and
 a second electroconductive part formed in the board attachment area of the second surface side of the board attachment by folding back the first surface of the board attachment on the second surface side, wherein
 the shield is grounded through the second electroconductive part.

14. The display device according to claim 10, wherein the first electroconductive part includes a positioning part that positions the circuit board when the circuit board is placed on the first surface of the first electroconductive part.

15. The display device according to claim 10, further comprising:
 a shield placed so as to cover the circuit board; and
 a second electroconductive part formed in the board attachment area of the second surface side of the board attachment by folding back the first surface of the board attachment on the second surface side, wherein
 the shield is grounded through the second electroconductive part.

16. The display device according to claim 9, wherein the first electroconductive part includes a positioning part that positions the circuit board when the circuit board is placed on the first surface of the first electroconductive part.

17. The display device according to claim 9, further comprising:
 a shield placed so as to cover the circuit board; and
 a second electroconductive part formed in a board attachment area of the second surface side of the board attachment by folding back the first surface of the board attachment on the second surface side, wherein
 the shield is grounded through the second electroconductive part.

18. The display device according to claim 1, further comprising:
 a shield placed so as to cover the circuit board; and
 a second electroconductive part formed in a board attachment area of the second surface side of the board attachment by folding back the first surface of the board attachment on the second surface side, wherein
 the shield is grounded through the second electroconductive part.

19. The display device according to claim 18, wherein the second electroconductive part is formed by cutting out the first surface of the board attachment on the second surface side.

20. A television device comprising:
 a display panel;
 a board attachment comprising:
  a first surface having electroconductivity placed on a side opposite to the display panel; and
  a second surface having no electroconductivity;
 a circuit board placed on a second surface side of the board attachment; and
 a first electroconductive part formed by folding back the first surface of the board attachment on the second surface side, wherein
 the circuit board is grounded through the first electroconductive part.

* * * * *